(12) United States Patent
Yumi

(10) Patent No.: US 6,465,738 B2
(45) Date of Patent: Oct. 15, 2002

(54) GROUNDING TERMINAL AND MOUNTING STRUCTURE OF THE SAME ON A PRINTED CIRCUIT BOARD

(75) Inventor: Hideo Yumi, Nagoya (JP)

(73) Assignee: Kitigawa Industries Co., Ltd., Nagoya (JP)

( * ) Notice: Subject to any disclaimer, the term of this patent is extended or adjusted under 35 U.S.C. 154(b) by 0 days.

(21) Appl. No.: 09/951,785

(22) Filed: Sep. 13, 2001

(65) Prior Publication Data

US 2002/0062989 A1 May 30, 2002

Related U.S. Application Data

(62) Division of application No. 09/301,807, filed on Apr. 28, 1999, now Pat. No. 6,300,579.

(30) Foreign Application Priority Data

Apr. 30, 1998 (JP) ............................................ 10-120616

(51) Int. Cl.⁷ ................................................. H01R 4/00
(52) U.S. Cl. ..................................... 174/84 R; 174/267
(58) Field of Search ................................. 174/261, 267, 174/86, 87, 84 R; 29/843

(56) References Cited

U.S. PATENT DOCUMENTS

| | | | |
|---|---|---|---|
| 3,504,095 A | 3/1970 | Roberson et al. | ............. 174/35 |
| 4,422,128 A | * 12/1983 | Zurlinden et al. | .......... 174/261 |
| 4,679,889 A | 7/1987 | Seidler | |
| 5,029,254 A | 7/1991 | Stickney | ....................... 174/35 |
| 5,441,429 A | 8/1995 | Seidler | |
| 5,749,741 A | 5/1998 | Bellas et al. | |
| 6,300,579 B1 | * 10/2001 | Yumi | .......................... 174/267 |
| 6,303,874 B1 | * 10/2001 | Muramatsu | .................. 174/260 |

FOREIGN PATENT DOCUMENTS

| | | |
|---|---|---|
| JP | 58-53372 | 4/1983 |
| JP | 62-195978 | 12/1987 |

* cited by examiner

Primary Examiner—David L. Talbott
Assistant Examiner—Jeremy Norris
(74) Attorney, Agent, or Firm—Davis & Bujold, P.L.L.C.

(57) ABSTRACT

The present invention realizes proper grounding of a printed circuit board to a grounding conductor by solving the problems in soldering a grounding terminal to a printed circuit board by reflow soldering, relating to a mounting structure of a grounding terminal on a printed circuit board formed by soldering a grounding terminal to the printed circuit board. Two joint surfaces having different surface areas are formed within the joint part of the grounding terminal, and the grounding terminal is soldered to the conductive pattern on the printed circuit board corresponding to the joint surfaces by using the solder having an amount corresponding to the surface area of each joint surface. Also, the bending area as the center of elastic deformation of the contact part of the grounding terminal is formed at a predetermined distance away from the relatively small joint surface of the joint part.

3 Claims, 6 Drawing Sheets

GROUNDING TERMINAL AND MOUNTING STRUCTURE OF THE SAME ON A PRINTED CIRCUIT BOARD

This application is a division of application Ser. No. 09/301,807, filed Apr. 28, 1999, now U.S. Pat. No. 6,300,579.

FIELD OF THE INVENTION

The invention relates to a mounting structure of a grounding terminal on a printed circuit board, wherein the printed circuit board is grounded to a grounding conductor by the grounding terminal, which is mounted on the surface of the printed circuit board by reflow soldering, contacting with and being pressed against the grounding conductor.

BACKGROUND OF THE INVENTION

Conventionally, a mounting structure of a grounding terminal on a printed circuit board for grounding the printed circuit board, in which a grounding terminal is mounted on the surface of the printed circuit board and pressed against a grounding conductor, is known. FIG. 5 is a plan view of such a conventional grounding structure and FIG. 6 is a longitudinal sectional view along line VI—VI of FIG. 5. As shown in FIG. 6, the grounding terminal 100 is soldered to the conductive pattern 201 on the printed circuit board 200 with solder 202. Then, the grounding terminal 100 is pressed against the grounding conductor, thereby grounding the printed circuit board 200. To illustrate the structure simply, the grounding conductor 300 is not shown in FIG. 5.

The grounding terminal 100 is formed by bending a strip-like thin sheet metal member with a width of α, for example, 0.8 mm, and has a joint part 101 with a longitudinal length of β, for example, 3.5 mm. One surface of the joint part 101 is a joint surface 101a which is soldered to the conductive pattern 201 on the printed circuit board 200. Also, the grounding terminal has a contact part 102 which adjoins the joint part 101 and is bent in the upper direction. An outer surface 102a of the contact part 102 is pressed against the grounding conductor 300. As the result of load by the grounding conductor, the contact part 102 is elastically deformed around the bending area γ, and is pressed against the grounding conductor 300 by restoring force caused by the elastic deformation, thereby electrically connecting the printed circuit board 200 and the grounding conductor 300 properly.

When the aforementioned grounding terminal is soldered to the printed circuit board, reflow soldering is usually employed. Reflow soldering comprises the steps of previously applying a suitable amount of solder to the point to be jointed, fixing the grounding terminal to the point temporarily, and melting the solder by using an external heat source, and all these steps are performed automatically. An advantage of reflow soldering is that by allowing a suitable amount of solder to be applied, it prevents solder from being placed at inappropriate points of the printed circuit board, and thus prevents improper soldering such as a defective bridge. Also, there is another advantage that in the case where a relatively small mounting member as aforementioned is to be mounted, self-alignment effect can be expected. That is, even if the temporarily fixed member deviates a little from the conductive pattern of the printed circuit board, the member is moved to the right position by surface tension of the melted solder.

However, there are the following problems in reflow soldering of the above conventional grounding terminal:

(1) The grounding terminal 100 is moved to the right position by self-alignment effect by surface tension of the melted solder, and then is finally positioned by hardening of the melted solder. During the hardening process of the solder, the grounding terminal 100 sometimes deviates from the right position on the printed circuit board 200 because of, for example, vibration. This results from the fact that since the amount of the solder is large, the thermal capacity of the solder is large, and thus it takes time for the solder to harden. If the grounding terminal 100 deviates from the right position, the contact part 102 may not be pressed against the grounding conductor 300 in an appropriate state. Furthermore, the requirements of highly precise mounting performance for allowing high density mounting are not satisfied.

(2) When the temperature of the grounding terminal 100 reaches the melting point of the solder earlier than that of the conductive pattern 201 of the printed circuit board 200, what is called wicking phenomenon occurs, by which the solder 202 is sucked up along the bending area γ forming the center of elastic deformation of the contact part 102 shown in FIG. 6. In this case, since the solder 202 adheres around the bending area γ, the elastic deformation performance of the contact part 102 is lowered, and thus it is sometimes impossible to attain elastic deformation enough for the contact part 102 to be pressed against the grounding conductor 300 and conduct electricity to the grounding conductor 300.

SUMMARY OF THE INVENTION

Wherefore, an object of the invention is to provide a mounting structure of a ground terminal on a printed circuit board formed by soldering, wherein by solving the problems caused by reflow soldering of the grounding terminal to the printed circuit board, the printed circuit board is properly grounded to a grounding conductor.

Another object of the invention is to provide a grounding terminal used for the above mounting structure.

In order to achieve the above objects, there is provided a grounding terminal mounted on a printed circuit board which is able to have contact with a grounding conductor, the grounding terminal comprising: a joint part having a plurality of joint surfaces which are to be soldered to a conductive pattern on the printed circuit board; a contact part extending from the joint part through a bending area bent in the opposite direction of the joint surfaces, and arranged to be able to have contact with the grounding conductor, which is elastically deformed upon being pressed by the grounding conductor; and at least one of the contact surfaces of the joint part having a smaller surface area than those of the other contact surfaces.

Also, there is provided a mounting structure in which a grounding terminal able to have contact with a grounding conductor is mounted on a printed circuit board, the grounding terminal comprising: a joint part having a plurality of joint surfaces which are to be soldered to a conductive pattern on the printed circuit board; a contact part extending from the joint part through a bending area bent in the opposite direction of the joint surfaces, and arranged to be able to have contact with the grounding conductor, which is elastically deformed upon being pressed by the grounding conductor; at least one of the contact surfaces of the joint part having a smaller surface area than those of the other contact surfaces; and the grounding terminal being mounted on the printed circuit board by reflow soldering, using an amount of solder corresponding to the surface area of each joint surface.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
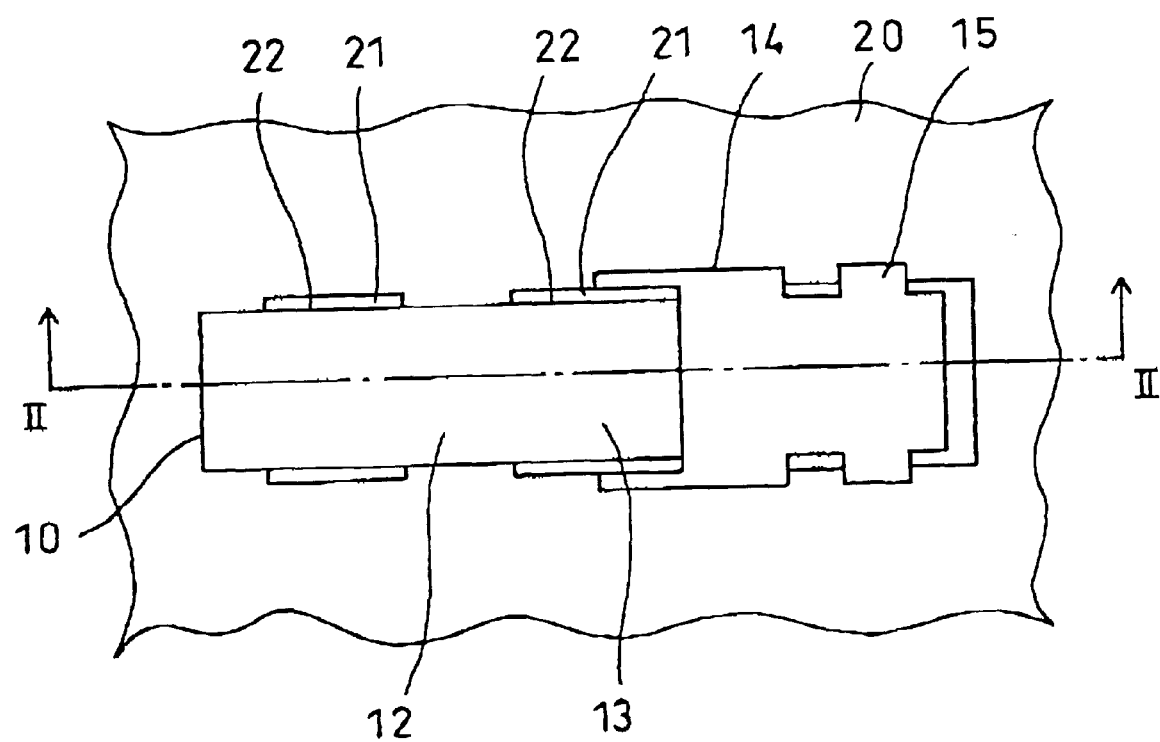
FIG. 1 is a plan view showing the mounting structure of a grounding terminal according to the embodiment of the invention.
Figure 2:
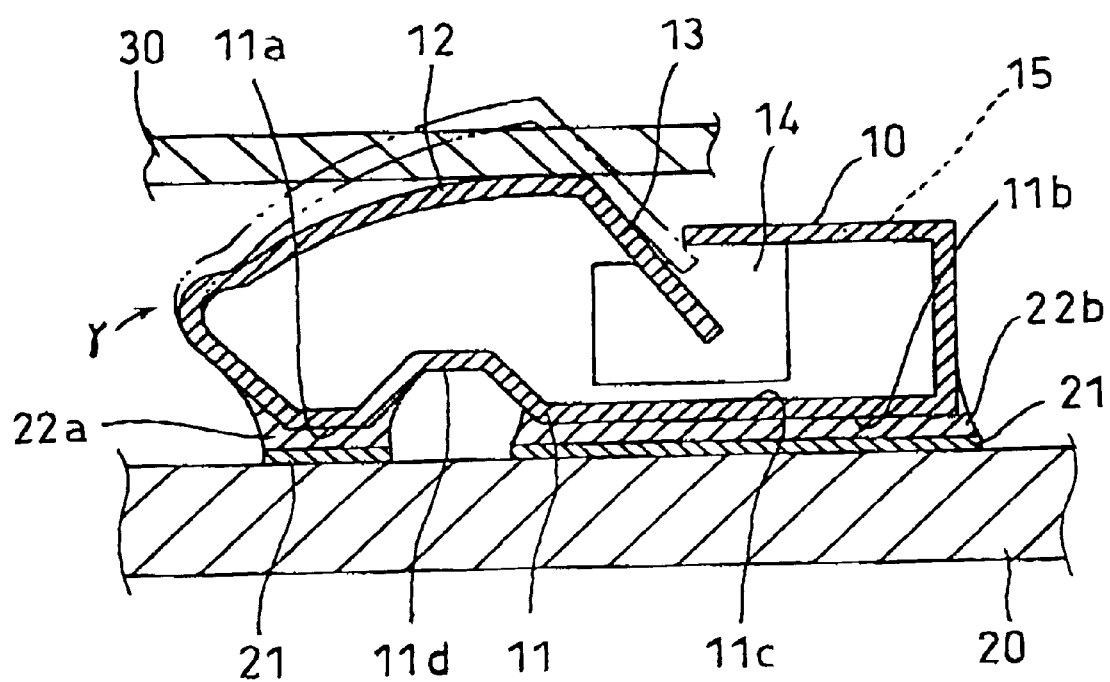
FIG. 2 is a longitudinal sectional view along line II—II of FIG. 1.

As shown in FIG. 2, the grounding structure in the embodiment is formed by soldering a grounding terminal 10 to a printed circuit board 20. The grounding terminal 10 soldered to the printed circuit board 20 is pressed against a grounding conductor 30, thereby ground the printed circuit board 20 to the grounding conductor 30. To illustrate the structure simply, the grounding conductor 30 is not shown in FIG. 1. The grounding conductor 30 may be a chassis or a metal shielding case which covers the printed circuit board 20.

The grounding terminal 10 in the embodiment is formed by bending a strip-like thin sheet metal member. The longitudinal center part of the metal member is a joint part 11, within which the metal member is bent such that the longitudinal section of the metal member forms a trapezoid, in other words, a groove 11d is formed on one side of the joint part 11. Two surfaces oppositely positioned across the groove 11d are joint surfaces 11a and 11b. In this case, the groove 11d is formed at a predetermined distance away from the longitudinal center of the joint part 11, and thus one joint surface 11a is smaller than the other joint surface 11b.

The metal member is bent in the upper direction at both ends of the joint part 11. At one end, the metal member is bent approximately perpendicularly to the joint part 11, and the bent part is further bent approximately perpendicularly so as to form a U-shaped longitudinal section with the joint part 11. Rectangular plate-like parts 14, which are bent perpendicularly in the direction of the joint part 11, are formed on both sides of the edge of the metal member. Also, projection parts 15 projecting from both sides of the metal member are formed at a predetermined distance away from the edge. The projection parts 15 are made by being separated from the neighboring member of the same shape when the strip-like thin sheet metal member is stamped out from a sheet metal.

The other end of the metal member is bent at the end of the joint part 11 so as to form a V-shaped longitudinal section. The peak of the V-shaped part has a gently curved longitudinal section instead of an acute one. A part which also has a gently curved longitudinal section from the peak of the V-shape part toward the edge of the metal member forms, together with the V-shaped part, a contact part 12. The part from the end of the contact part 12 to the edge having a straight longitudinal section is bent in the direction of the joint part 11, and forms a restriction part 13.

Once the grounding terminal 10 is soldered and fixed on the printed circuit board, which is then placed in a metal shielding case and the like, the contact part 12 contacts with and is pressed against the grounding conductor 30, thus being elastically deformed around the peak of the above mentioned V-shaped part.

FIG.2 shows the state that the contact part 12 is elastically deformed by being pressed against the grounding conductor 30. Two-dot chain line of FIG. 2 shows the state that the contact part 12 is not pressed against the grounding conductor 30. The main function of the plate-like parts 14 is to restrict the movement of the contact part 12 such that the elastic deformation of the contact part 12 is performed without fluctuation. The restoring force caused by the elastic deformation makes the contact part 12 securely pressed against the grounding conductor 30, thereby properly grounding the printed circuit board 20 to the grounding conductor 30.

The mounting structure of the invention is formed by soldering, specifically by reflow soldering, the grounding terminal 10 having the joint part 11, the contact part 12, and the restriction part 13 as above mentioned to the printed circuit board 20.

Specific steps of soldering are explained hereafter.

On the printed circuit board 20 is formed a conductive pattern 21, which corresponds to the joint surfaces 11a and 11b configured within the joint part 11 of the grounding terminal 10. Before soldering, creamed solder 22a and 22b are applied on the conductive pattern 21 using a known metal mask. The grounding terminal 10 is temporarily fixed to a prescribed position on the printed circuit board 20 by taking advantage of adhesion of the creamed solder applied on the conductive pattern 21 of the printed circuit board 20. Then the printed circuit board 20, on which the grounding terminal 10 is temporarily fixed, is heated in a reflow furnace to allow the aforementioned creamed solder 22 to be melted, and the soldering steps end. The above reflow soldering is automatically performed, by means of total heating such as infrared heating, latent heating of vaporization, hot air circulation heating, and hot plate heating, and local heating using a heating tool, a light beam, a laser beam, and an air heater. Since reflow soldering is known, a detailed explanation of it is omitted.

The aforementioned grounding structure according to the embodiment of the invention has particular advantages in the process of reflow soldering as explained below. To make the explanation easy to understand, problems in a conventional grounding structure are firstly clarified.

Figure 6:
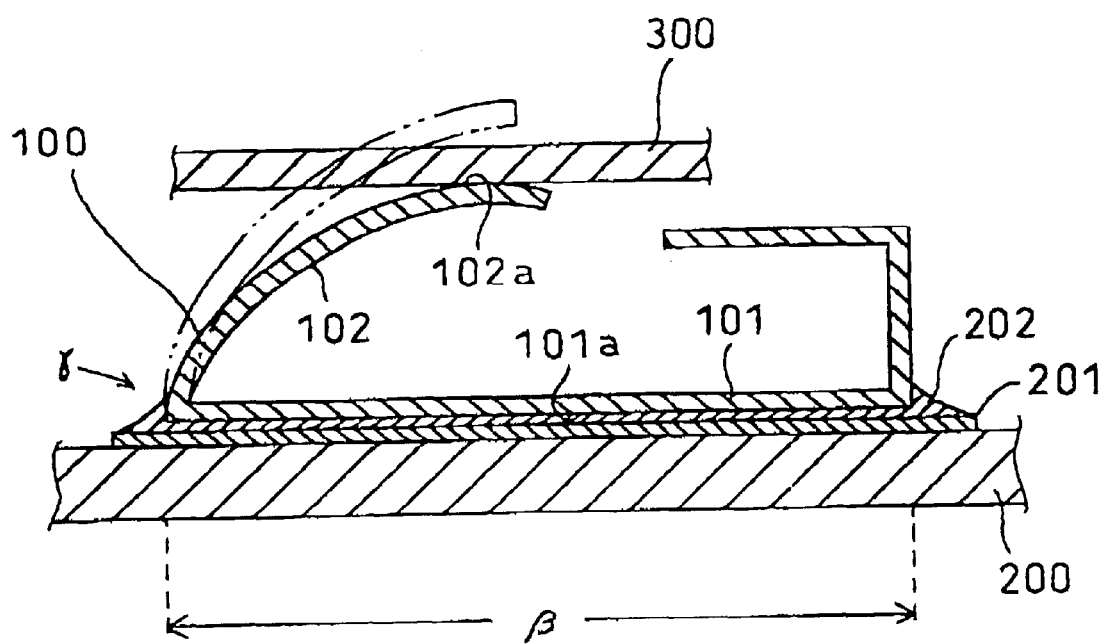
FIG. 6 is a longitudinal sectional view along line VI—VI of FIG. 5.

In a conventional grounding structure shown in FIG. 6, there are the following problems in soldering the grounding terminal 10 to the printed circuit board 200 by reflow soldering.

(A) The grounding terminal 100 is moved to the right position by self-alignment effect caused by the melted solder, and then is fixed at the position by hardening of the melted solder. In this case the grounding terminal 100 may deviate, during the hardening process, from the right position on the printed circuit board 200 because of vibration and the like. In the case where the grounding terminal deviates from the right position, the contact part 102 cannot be appropriately pressed against the grounding conductor 300, and also the requirements of highly precise mounting performance to allow high density mounting cannot be satisfied.

(B) When the temperature of the grounding terminal 100 reaches the melting point of the solder earlier than the conductive pattern 201 of the printed circuit board 200, what is called wicking phenomenon occurs. Wicking phenomenon, here, means a phenomenon that the solder 202 is sucked up along the bending area γ forming the center of elastic deformation of the contact part 102 shown in FIG. 6. In this case, since the solder 202 adheres and hardens around the bending area γ, the elastic deformation performance of the contact part 102 is lowered, and thus it is sometimes impossible to attain elastic deformation enough for the contact part 102 to be pressed against the grounding conductor 300 and conduct electricity to the grounding conductor 300.

In contrast, in the grounding structure according to the embodiment of the invention, two joint surfaces 11a and 11b having different surface areas are formed within the joint part 11 of the grounding terminal 10. As a result, the creamed solder 22a applied on the relatively small joint surface 11a hardens earlier than the creamed solder 22b applied on the relatively large joint surface 11b, when the printed circuit board 20 is cooled after the grounding terminal 10 is moved to the right position on the printed circuit board 20 by self-alignment effect caused by the surface tension of the melted creamed solder 22a and 22b. Accordingly, once the creamed solder 22a applied on the smaller joint surface 11a hardens, the grounding terminal 10 does not deviate from the right position on the printed circuit board 20 because of vibration and the like. This reduces the possibility of the grounding terminal 10 deviating from the right position on the printed circuit board 20 while cooling the printed circuit board 20, and thus has solved the problems mentioned in (A). Namely, the possibility of the contact part 12 not being appropriately pressed against the grounding conductor 30 is reduced, and also the requirements of highly precise mounting performance to allow high density mounting are satisfied.

Another advantage is as follows: in the case where two joint surfaces 11a and 11b having different surface areas are formed within the joint part 11 of the grounding terminal 10, when the printed circuit board 20 with the grounding terminal 10 at the prescribed position thereon is heated in a reflow furnace, the solder 22a applied on the relatively small joint surface 11a is melted earlier than the solder 22b applied on the relatively large joint surface 11b. This may result in what is called tombstone phenomenon (Manhattan phenomenon), which means, in this case, the grounding terminal 10 is made to erect because of the surface tension of the melted solder. However, in the embodiment of the invention, the creamed solder 22a and 22b, which is a paste mixture of powdered solder and a vehicle, is employed. As a result, there is a strong possibility that the adhesion of the creamed solder offsets the force to detach the joint surface 11b from the conductive pattern 21 on the printed circuit board 20 caused by the surface tension of the previously melted solder. Moreover, in the embodiment of the invention, since the size of the joint surfaces of 11a and 11b is different, the adhesion of the creamed solder 22b on the larger joint surface 11b is probably stronger than the force to detach the joint surface 11b caused by the surface tension of the melted creamed solder 22a on the smaller joint surface 11a. Thus tombstone phenomenon is prevented effectively.

A further advantage is as follows: in the mounting structure of the embodiment, the bending area γ is formed at a predetermined distance away from the relatively small joint surface 11a of the joint part 11. As a result, since the creamed solder 22a applied on the smaller joint surface 11a is not sucked up, by wicking phenomenon, to the bending area γ of the contact part 12, the solder 22a does not adhere around the bending area γ. This prevents the elastic deformation performance of the contact part 12 from declining because of the solder adhering around the bending area γ. Thus, the aforementioned problem (B) is solved and the contact part 12 is appropriately pressed against the grounding conductor 30.

Figure 3:
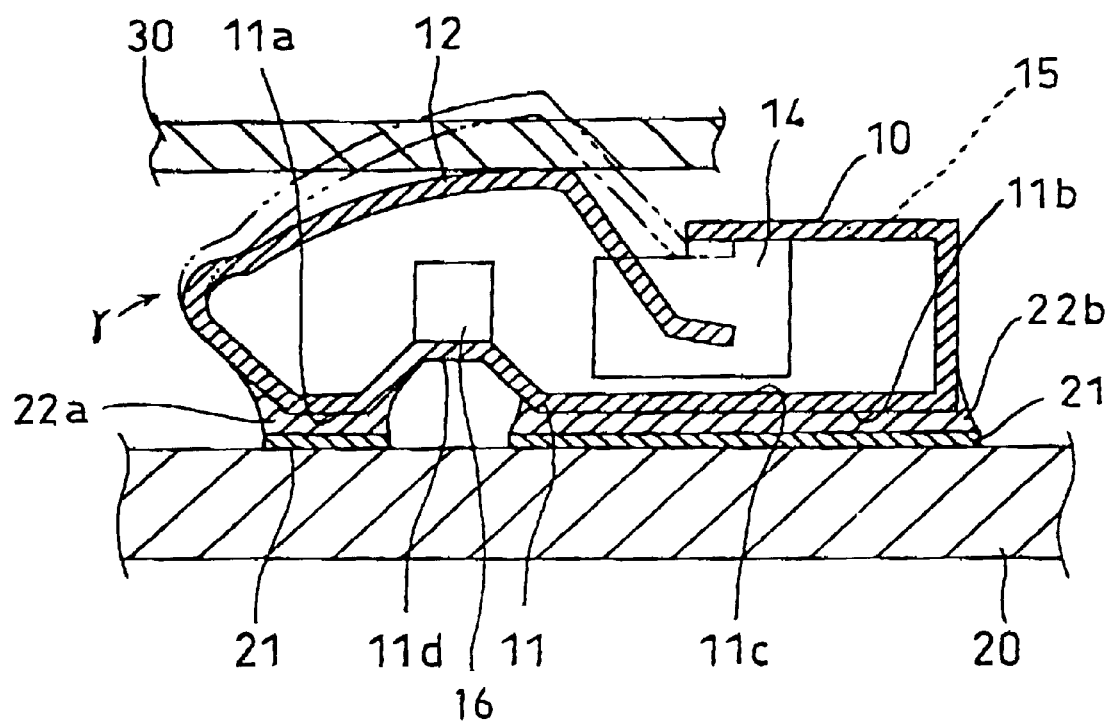
FIGS. 3 and 4 show modifications of the restriction part, respectively, in the invention.
Figure 4:
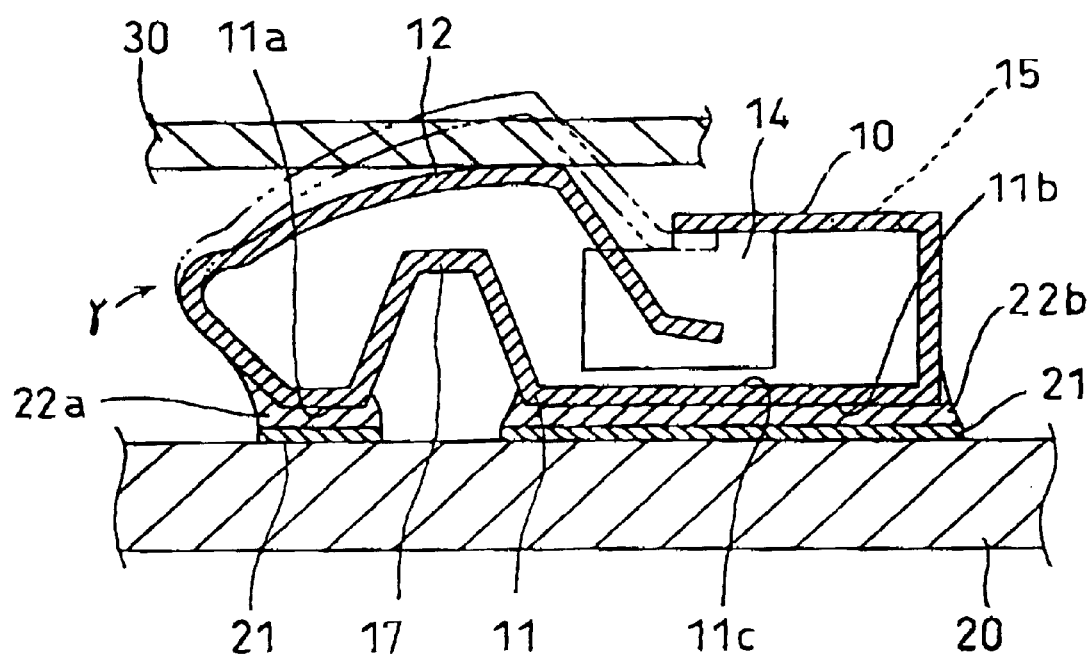
Figure 5:
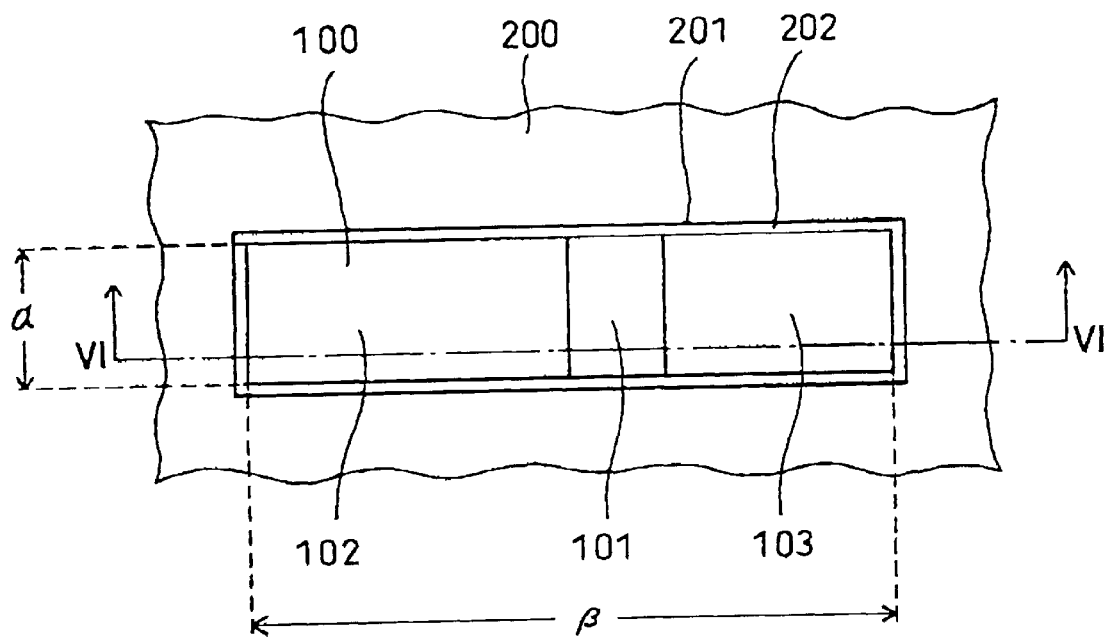
FIG. 5 is a plan view showing a conventional mounting structure of a grounding terminal on a printed circuit board.

The mounting structure of the embodiment provides another advantage as follows: a restriction part 13 adjacent to the contact part 12 of the grounding terminal 10 is formed so that the stress caused to the contact part 12 by the elastic deformation thereof will not exceed the elastic limit. When the contact part 12 is elastically deformed to a predetermined extent, the restriction part 13 restricts the elastic deformation by contacting and pressing its edge to a surface 11c on the reverse side of the joint surface 11b of the joint part 11. The predetermined extent means the extent of elastic deformation which does not allow the stress caused to the contact part 12 to exceed the elastic limit. This prevents a permanent deformation of the contact part 12 even though a heavy load is applied thereto. Although the restriction part 13 is formed adjacent to the contact part 12 of the grounding terminal 10 in FIG. 2, it may be possible to form a restriction part on the reverse side of the joint surfaces 11a and 11b of the joint part 11 as shown in FIG. 3 and 4 such that the restriction part is pressed against the contact part 12. In a modification shown in FIG. 3, a member 16 is formed as part of the metal member such that the member 16 extends from a side end of the top surface of the above mentioned trapezoid part and bent in the upper direction, allowing the top edge of the member 16 to function as a restriction part. In a modification shown in FIG. 4, the trapezoid part of FIG. 2 is redesigned to have a significant elevation, and the trapezoid part 17 functions as a restriction part.

As described above, the mounting structure of the embodiment have solved the problems in soldering the grounding terminal 10 to the printed circuit board 20 by reflow soldering, ensuring that the printed circuit board 20 is properly grounded to the grounding conductor 30.

The invention is not restricted to the embodiment and may be embodied in various forms without departing from the spirit and the scope of the invention.

For example, in the mounting structure of the embodiment, two joint surfaces 11a and 11b having different surface areas, respectively, are formed within the joint part 11 of the grounding terminal 10. However, when a grounding terminal having a joint part, within which three or more joint surfaces are formed, is soldered to a printed circuit board, only one of the joint surfaces needs to be smaller than the others.

Also, in the mounting structure of the embodiment, the creamed solder 22a and 22b is applied to both of the two joint surfaces 11a and 11b formed within the joint part 11 of the grounding terminal 10. However, in order to prevent tombstone phenomenon, only the solder applied on the larger joint surface 11b needs to be creamed solder 22b. In other words, to prevent tombstone phenomenon, the adhesion on the larger joint surface 11b is necessary to resist against the surface tension of the solder which is melted first on the smaller joint surface 11a.

What is claimed is:

1. A grounding terminal for mounting to a printed circuit board and engagement with a grounding conductor, the grounding terminal comprising:

a joint part having a plurality of joint surfaces for soldering the grounding terminal to a conductive pattern on a printed circuit board;

a contact part extending from and being connected to the joint part via a bending part, the contact part bending back over the joint surfaces and being configured to facilitate engagement with a grounding conductor, and the contact part being elastically deformable toward a rear surface of the joint surfaces upon engaging with a grounding conductor; and at least one of the joint surfaces of the joint part having a surface area which is smaller than a surface area of all remaining joint surfaces;

wherein there is difference in hardening periods of solder applied to the joint surfaces between the smaller joint surface and the remaining joint surfaces of the joint part.

2. The grounding terminal according to claim 1, wherein the grounding terminal further comprises at least one intermediate part between the smaller surface and the remaining surfaces, the intermediate part is trapezoidal so that the intermediate part, once the contact part is deformed to a predetermined extent, contacts with the contact part to restrict further elastic deformation of the contact part.

3. The grounding terminal according to claim 1, wherein the bending part is formed a predetermined distance away from the joint surface of the joint part.

* * * * *